(12) United States Patent
Wataya et al.

(10) Patent No.: US 8,445,931 B2
(45) Date of Patent: May 21, 2013

(54) WAVELENGTH CONVERTING MEMBER, LIGHT-EMITTING DEVICE, AND METHOD FOR MANUFACTURING WAVELENGTH CONVERTING MEMBER

(75) Inventors: Kazuhiro Wataya, Echizen (JP); Toshihiko Tsukatani, Echizen (JP); Yasushi Takai, Echizen (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 206 days.

(21) Appl. No.: 13/102,147

(22) Filed: May 6, 2011

(65) Prior Publication Data

US 2011/0272725 A1  Nov. 10, 2011

(30) Foreign Application Priority Data

May 10, 2010  (JP) .................................. 2010-108249

(51) Int. Cl.
*H01L 33/00* (2010.01)

(52) U.S. Cl.
USPC ................. 257/98; 257/88; 257/99; 257/103; 313/484; 313/503; 313/506

(58) Field of Classification Search
None
See application file for complete search history.

(56) References Cited

U.S. PATENT DOCUMENTS 7,514,721 B2 * 4/2009 Krames et al. .................. 257/98

FOREIGN PATENT DOCUMENTS

| EP | 1 837 921 A1 | 9/2007 |
| EP | 1 980 606 A1 | 10/2008 |
| FR | 2 901 785 A1 | 12/2007 |
| JP | 2007-150331 A | 6/2007 |
| WO | 2007/063460 A1 | 6/2007 |

OTHER PUBLICATIONS

Satya, et al., "Solid Solution Formation and Ce3+ Luminescence in Silicate Garnets", Electrochemical and Solid-State Letters, dated Apr. 6, 2010, vol. 13, No. 6, pp. J77-J80, XP002671558. Cited in European Search Report dated Apr. 19, 2012.
European Search Report dated Apr. 19, 2012, issued in corresponding European Patent Application No. 11003696.9, (6 pages).

* cited by examiner

*Primary Examiner* — Kyoung Lee
(74) *Attorney, Agent, or Firm* — Westerman, Hattori, Daniels & Adrian, LLP

(57) ABSTRACT

A polycrystalline sintered ceramic including (A) a garnet phase and (B) a perovskite, monoclinic or silicate phase wherein fine grains of phase (B) are included and dispersed in phase (A) is used as a wavelength converting member. Since the light transmitting through the wavelength converting member is scattered at the interface between the garnet phase and the perovskite, monoclinic or silicate phase, a light emitting device including the wavelength converting member produces light of more uniform color with a minimized loss thereof.

8 Claims, 4 Drawing Sheets

WAVELENGTH CONVERTING MEMBER, LIGHT-EMITTING DEVICE, AND METHOD FOR MANUFACTURING WAVELENGTH CONVERTING MEMBER

CROSS-REFERENCE TO RELATED APPLICATION

This non-provisional application claims priority under 35 U.S.C. §119(a) on Patent Application No. 2010-108249 filed in Japan on May 10, 2010, the entire contents of which are hereby incorporated by reference.

TECHNICAL FIELD

This invention relates to a wavelength converting member for use with a light source for wavelength converting a portion of light from the light source while allowing another portion of light to pass therethrough, a light-emitting device using the member, and a method for manufacturing the member.

BACKGROUND ART

Light-emitting diodes are among the most efficient light sources currently available. Active efforts are made to develop white light emitting devices by combining blue LED with phosphors. For example, JP-A 2007-150331 discloses a wavelength converting member including garnet or the like, specifically a light-transmissive, homogeneous wavelength converting member capable of wavelength converting light emitted by a light emitting component, and a light emitting device including the wavelength converting member. The wavelength converting member is expected to have higher heat resistance and higher mechanical strength than the prior art wavelength converting layer including a phosphor and a resin in which the phosphor is dispersed, and is also expected to have high durability against the heat that increases as the output of light emitting components increases.

In the case of a wavelength converting member using garnet which is light-transmissive and homogeneous, a portion of light from a light source that is transmitted by the wavelength converting member travels straightforward through the wavelength converting member whereas a portion of light that is absorbed and wavelength converted by the wavelength converting member travels isotropically in all directions. Thus the transmitted light and the wavelength converted light have different patterns of light distribution. As a result, the light output from a light emitting device including such a wavelength converting member fails in color uniformity and only an illuminated surface with variations in color is available from the light emitting device. As the countermeasure to this problem, an opaque or translucent light-diffusing member is disposed outside the light emitting device to mitigate the visible variation in color of the illuminated surface. The use of the light-diffusing member leads to a lowering of light utilization efficiency because of a partial loss of light across the light-diffusing member.

CITATION LIST

Patent Document 1: JP-A 2007-150331 (U.S. Pat. No. 7,514,721, EP 1958269)

SUMMARY OF INVENTION

An object of the invention is to provide a wavelength converting member for use with a light source for wavelength converting a portion of light from the light source while allowing another portion of light to transmit, which member mitigates the visible variation in color due to different luminous distribution between the transmitted light and the wavelength-converted light and can provide an illuminated surface with uniform color, a light-emitting device using the member, and a method for manufacturing the member.

In a light emitting device using a wavelength converting member, an effective means for mitigating the visible variation in color due to different luminous distribution between the transmitted light and the wavelength-converted light is to let the transmitted light scatter within the wavelength converting member while minimizing the loss of the transmitted light.

For example, to let light scatter while transmitting through the wavelength converting member in the form of a sintered body, it might be contemplated to intentionally reduce the sintered density to incorporate pores or bubbles for reducing the visible variation in color of light emitted by the light emitting device. In this attempt, because of a substantial difference in refractive index between the wavelength converting member and the bubbles, light reflection and scattering occur at the interface between the member and the bubbles. Undesirably, the emission efficiency of the light emitting device is reduced.

The inventor has found that when a polycrystalline sintered ceramic including (A) a garnet phase and (B) a perovskite, monoclinic or silicate phase wherein fine grains of phase (B) are included and dispersed in phase (A) is used as a wavelength converting member to construct a light emitting device, the light transmitting through the wavelength converting member is adequately scattered at the interface between the garnet phase and the perovskite, monoclinic or silicate phase, thereby reducing the visible variation in color of light emitted by the light emitting device while minimizing a lowering of emission efficiency of the light emitting device.

In one aspect, the invention provides a wavelength converting member including a polycrystalline sintered ceramic including (A) a garnet phase and (B) at least one phase selected from the group consisting of perovskite, monoclinic and silicate phases, wherein fine grains of phase (B) are included and dispersed in phase (A). The garnet phase as phase (A) has the compositional formula (1):

$$(A_{1-x}B_x)_3C_5O_{12} \quad (1)$$

wherein A is at least one rare earth element selected from the group consisting of Y, Gd, and Lu, B is at least one rare earth element selected from the group consisting of Ce, Nd, and Tb, C is at least one element selected from the group consisting of Al and Ga, and x is a number from 0.002 to 0.2.

In preferred embodiments, the perovskite phase includes at least one rare earth element selected from the group consisting of Y, Gd, and Lu, at least one rare earth element selected from the group consisting of Ce, Nd, and Tb, at least one element selected from the group consisting of Al and Ga, and oxygen; the monoclinic phase includes at least one rare earth element selected from the group consisting of Y, Gd, and Lu, at least one rare earth element selected from the group consisting of Ce, Nd, and Tb, at least one element selected from the group consisting of Al and Ga, and oxygen; and the silicate phase includes at least one rare earth element selected from the group consisting of Y, Gd, and Lu, at least one rare earth element selected from the group consisting of Ce, Nd, and Tb, at least one element selected from the group consisting of Al and Ga, silicon, and oxygen. Preferably, the fine grains of phase (B) have an average grain size of at least 0.1 μm. Also preferably, the sintered ceramic has a porosity of up to 0.1% by volume.

In another aspect, the invention provides a light-emitting device including a light source and the wavelength converting member defined above wherein a portion of light from the light source passes through the wavelength converting member and another portion of light from the light source is wavelength converted by the wavelength converting member and these portions are combined to produce a light output.

In a further aspect, the invention provides a method for manufacturing the wavelength converting member defined above, including the steps of mixing a first source powder including the elements contained in phase (A) in such a composition as to form phase (A), with a second source powder comprising the elements contained in phase (B) in such a composition as to form phase (B), shaping the powder mixture into a formed body, and heating the body for sintering.

ADVANTAGEOUS EFFECTS OF INVENTION

Since the light transmitting through the wavelength converting member is scattered at the interface between the garnet phase and the perovskite, monoclinic or silicate phase, the light emitting device including the wavelength converting member produces a light output of more uniform color with a minimized loss thereof. Since the uniformity of distribution between the transmitted light and the wavelength converted light is improved over the prior art, the light emitting device including the wavelength converting member provides an illuminated surface with minimized visible variation in color.

DESCRIPTION OF EMBODIMENTS

The wavelength converting member of the invention includes a polycrystalline sintered ceramic including (A) a garnet phase and (B) at least one phase selected from among perovskite, monoclinic and silicate phases. In the wavelength converting member, fine grains or crystals formed of phase (B) are included and dispersed in crystals formed of phase (A) as the primary phase.

Figure 1:
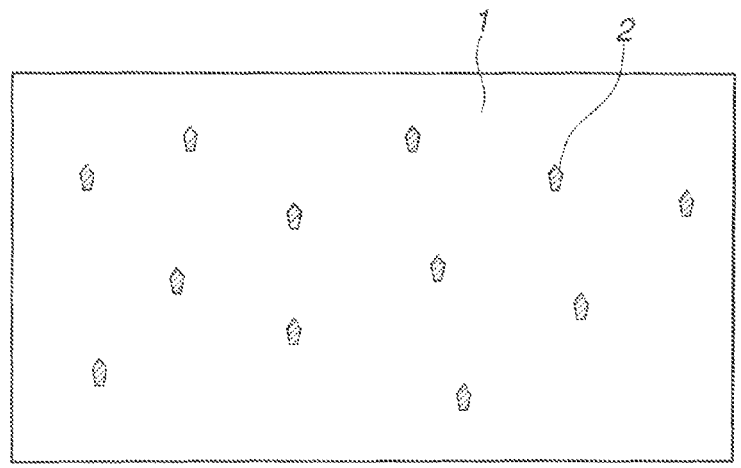
FIG. 1 schematically illustrates the wavelength converting member in which phase (B) is included and dispersed in phase (A).

As seen from a schematic cross-sectional view of a wavelength converting member in FIG. 1, the state that these phases take is a structure that fine grains 2 of phase (B), i.e., at least one phase selected from among perovskite, monoclinic and silicate phases are dispersed and distributed in a crystal (matrix) 1 of phase (A), i.e., garnet phase. Two distinct phases form a so-called island-in-sea structure.

The wavelength converting member includes a polycrystalline sintered ceramic of this phase structure. When the wavelength converting member is used in a light emitting device adapted to produce a light output as a result of transmission of a portion of light from a light source through the wavelength converting member and wavelength conversion of another portion of light by the wavelength converting member, both the light transmitted by the wavelength converting member and the light converted by the wavelength converting member are adequately scattered at the interface between the garnet phase and the perovskite, monoclinic or silicate phase. This reduces the visible variation in color of the light output from the light emitting device while minimizing a lowering of emission efficiency of the light emitting device.

A ratio of phase (B) to phase (A), i.e., B/A is preferably from 0.001 to 0.2, and more preferably from 0.001 to 0.1. If the ratio B/A is beyond the range, the emission efficiency may be reduced. If the ratio B/A is below the range, the effect of scattering in improving the visible variation in color may be reduced. A ratio B/A may be set within the range by controlling a ratio of source powders corresponding to the respective phases during preparation of a sintered body.

Fine grains or crystals of phase (B) have an average grain size of preferably at least 0.1 μm and also preferably up to 1 mm. With a grain size of less than 0.1 μm, the effect of scattering the transmitted light may become reduced. A grain size of more than 1 mm has a possibility that such a large grain size invites a loss of transmission of light.

Also preferably the sintered ceramic has a porosity of up to 0.5% by volume, and more preferably up to 0.1% by volume. A porosity beyond the range has a possibility that the light transmitted by the wavelength converting member and the light absorbed and wavelength converted by the wavelength converting member are scattered into pores within the wavelength converting member and thus lost, leading to a lowering of emission efficiency.

In the wavelength converting member of the invention, the garnet phase as phase (A) is preferably a garnet phase having the compositional formula (1):

$$(A_{1-x}B_x)_nC_5O_{12} \tag{1}$$

wherein A is at least one rare earth element selected from among Y, Gd, and Lu, B is at least one rare earth element selected from among Ce, Nd, and Tb, C is at least one element selected from among Al and Ga, and x is a number from 0.002 to 0.2.

On the other hand, the perovskite phase as phase (B) is preferably an oxide perovskite phase containing at least one rare earth element selected from among Ce, Nd, and Tb, more preferably a perovskite phase containing at least one rare earth element selected from among Y, Gd, and Lu, at least one rare earth element selected from among Ce, Nd, and Tb, at least one element selected from among Al and Ga, and oxygen. Specifically, the perovskite phase has the compositional formula (2):

$$(A_{1-y}B_y)CO_3 \tag{2}$$

wherein A, B, and C are as defined above, and y is a number from 0.002 to 0.98.

Also the monoclinic phase as phase (B) is preferably an oxide monoclinic phase containing at least one rare earth element selected from among Ce, Nd, and Tb, more preferably a monoclinic phase containing at least one rare earth element selected from among Y, Gd, and Lu, at least one rare earth element selected from among Ce, Nd, and Tb, at least one element selected from among Al and Ga, and oxygen. Specifically, the monoclinic phase has the compositional formula (3):

$$(A_{1-z}B_z)_4C_2O_9 \tag{3}$$

wherein A, B, and C are as defined above, and z is a number from 0.002 to 0.98.

Also the silicate phase as phase (B) is preferably a silicate phase containing at least one rare earth element selected from among Ce, Nd, and Tb, more preferably a silicate phase containing at least one rare earth element selected from among Y, Gd, and Lu, at least one rare earth element selected from among Ce, Nd, and Tb, at least one element selected from among Al and Ga, silicon, and oxygen.

The wavelength converting member of polycrystalline ceramic is preferably manufactured by a sintering technique because of the advantage that phase (B) can be uniformly dispersed in phase (A), although it may be manufactured by any other techniques.

In the manufacture by the sintering technique, a ceramic powder having a content ratio or composition corresponding to or approximate to the garnet phase is prepared as a source powder containing the elements of phase (A) in a sufficient composition to develop phase (A). It is prepared by mixing powders in oxide, hydroxide and other forms of the elements contained in the garnet phase so as to give the desired content ratio, and firing the mixture in ambient atmosphere or vacuum at a temperature of 900 to 1,500° C. for 10 minutes to 8 hours. There is obtained a source powder of the garnet phase-forming mono-phase composition.

A source powder containing the elements of phase (B) in a sufficient composition to develop phase (B) is prepared as follows. Where phase (B) is a perovskite or monoclinic phase, as in the case of garnet phase, a ceramic powder having a content ratio or composition corresponding to or approximate to the perovskite phase or a ceramic powder having a content ratio or composition corresponding to or approximate to the monoclinic phase is prepared by mixing powders in oxide and other forms of the elements contained in the relevant phase so as to give the desired content ratio, and firing the mixture in ambient atmosphere or vacuum at a temperature of 900 to 1500° C. for 10 minutes to 8 hours. There is obtained a source powder of the relevant phase-forming mono-phase composition.

Where phase (B) is a silicate phase, a powder of a silicon-containing compound such as silicon oxide or silicone resin may be used as the source powder for phase (B). It is believed that when a garnet phase having compositional formula (1) is applied as phase (A), a part or all of the silicon compound added forms a silicate phase consisting of elements A, B and C (in formula (1)) and silicon and oxygen in the course of sintering.

Next, the source powder for forming phase (A) and the source powder for forming phase (B) are mixed so as to provide the above-described ratio B/A. The resulting powder mixture is shaped by a pressing, slip casting or sheeting technique. The obtained product is heated and fired in an ambient atmosphere, reduction atmosphere or vacuum into a dense ceramic sintered body serving as a wavelength converting member. In particular, vacuum sintering is preferred in order to minimize bubbles in the wavelength converting member.

To increase the density of the wavelength converting member, the sintering temperature is preferably at least 1,700° C., more preferably at least 1,750° C. The sintering temperature is preferably up to 2,000° C. Sintering temperatures above the range are economically disadvantageous. The sintering time is usually about 4 to about 24 hours. In the sintering step, not only phase (A) serving as the primary phase forms, but also phase (B) forms, and phase (B) is present as being dispersed in phase (A).

EXAMPLE

Examples of the invention are given below by way of illustration and not by way of limitation.

Example 1

In a mixer, a 99.9% purity yttrium oxide $Y_2O_3$ powder having an average particle size of 1.0 μm, a 99.0% purity aluminum oxide $Al_2O_3$ powder having an average particle size of 0.5 μm, and a 99.9% purity cerium oxide $CeO_2$ powder having an average particle size of 0.2 μm were combined in a molar ratio of Y:Al:Ce=2.98:5:0.02 and mixed for 30 minutes, obtaining 500 g of a powder mixture. The powder mixture was fired in ambient atmosphere at 1,400° C. for 4 hours, yielding 500 g of a source powder (1-1) of garnet phase-forming mono-phase composition.

Separately, a 99.9% purity yttrium oxide $Y_2O_3$ powder having an average particle size of 1.0 μm, a 99.0% purity aluminum oxide $Al_2O_3$ powder having an average particle size of 0.5 μm, and a 99.9% purity cerium oxide $CeO_2$ powder having an average particle size of 0.2 μm were mixed in a molar ratio of Y:Al:Ce=2.98:3.00:0.02, obtaining 1 g of a powder mixture. The powder mixture was fired in ambient atmosphere at 1,400° C. for 4 hours, yielding 1 g of a source powder (1-2) of perovskite phase-forming mono-phase composition.

These source powders (1-1) and (1-2) were mixed in a mixer for 1 hour, obtaining a source powder (1) for sintering. The source powder (1) was press molded by a uniaxial press and vacuum sintered at 1,750° C., yielding a dense sintered body. From the sintered body, a strip of 1.5 mm long, 2.0 mm wide and 200 μm thick was cut out, which was ready for use as a wavelength converting member.

Figure 2:
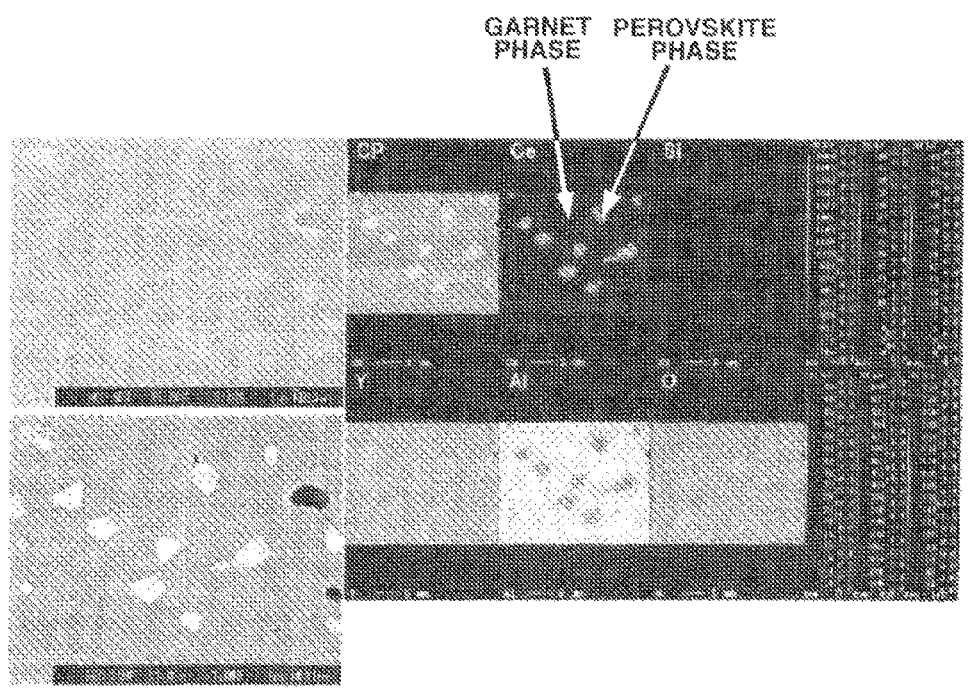
FIG. 2 illustrates an electron micrograph and EPMA image of the wavelength converting member obtained in Example 1.

This wavelength converting member was measured to have a sintered density of 4.55 $g/cm^3$ and a porosity of 0.1 vol %. An observation in cross section of the wavelength converting member indicated a dense sintered body with few bubbles. On qualitative analysis of the wavelength converting member by XRD, the primary phase consisted of YAG phase (garnet phase) and the presence of YAP phase (perovskite phase) was confirmed. An electron microscope observation and electron probe microanalysis (EPMA) of the wavelength converting member demonstrated the structure that YAP phase grains having an average grain size of about 3 μm were present in YAG phase in the state that YAP phase grains were included and dispersed in YAG phase. FIG. 2 illustrates the electron micrograph and EPMA image.

When the wavelength converting member was activated with light of 470 nm, it showed an inner quantum efficiency of 0.90. Also, when one surface of the wavelength converting member was illuminated by a point source of 470 nm, it produced light emission free of visible variation in color on its surface opposite to the illuminated surface.

Example 2

Source powder (1-1), 500 g, was obtained by the same procedure as in Example 1. Separately, a 99.9% purity yttrium oxide $Y_2O_3$ powder having an average particle size of 1.0 μm, a 99.0% purity aluminum oxide $Al_2O_3$ powder having an average particle size of 0.5 μm, and a 99.9% purity cerium oxide $CeO_2$ powder having an average particle size of 0.2 μm were mixed in a molar ratio of Y:Al:Ce=3.98:2.00:0.02, obtaining 1 g of a powder mixture. The powder mixture was fired in ambient atmosphere at 1,400° C. for 4 hours, yielding 1 g of a source powder (2-2) of monoclinic phase-forming mono-phase composition.

These source powders (1-1) and (2-2) were mixed in a mixer for 1 hour, obtaining a source powder (2) for sintering. The source powder (2) was press molded by a uniaxial press and vacuum sintered at 1,750° C., yielding a dense sintered body. From the sintered body, a strip of 1.5 mm long, 2.0 mm wide and 200 μm thick was cut out, which was ready for use as a wavelength converting member.

Figure 3:
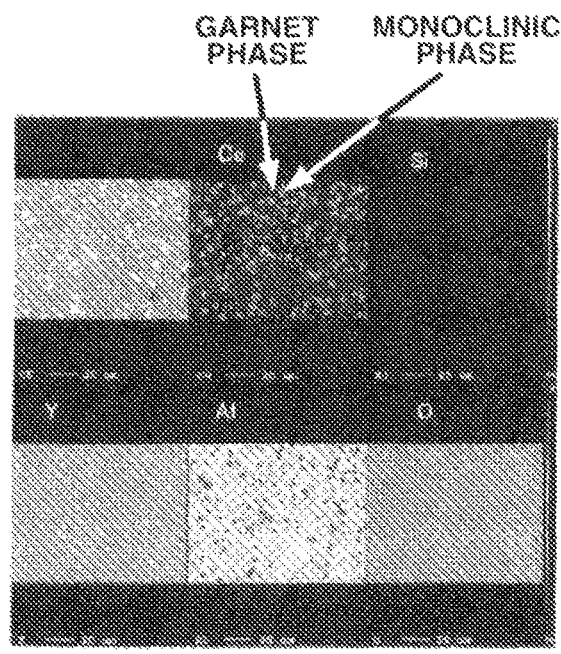
FIG. 3 illustrates an electron micrograph and EPMA image of the wavelength converting member obtained in Example 2.

This wavelength converting member was measured to have a sintered density of 4.55 g/cm$^3$ and a porosity of 0.1 vol %. An observation in cross section of the wavelength converting member indicated a dense sintered body with few bubbles. On qualitative analysis of the wavelength converting member by XRD, the primary phase consisted of YAG phase (garnet phase) and the presence of YAM phase (monoclinic phase) was confirmed. An electron microscope observation and EPMA of the wavelength converting member demonstrated the structure that YAM phase grains having an average grain size of about 5 μm were present in YAG phase in the state that YAM phase grains were included and dispersed in YAG phase. FIG. 3 illustrates the electron micrograph and EPMA image.

When the wavelength converting member was activated with light of 470 nm, it showed an inner quantum efficiency of 0.92. Also, when one surface of the wavelength converting member was illuminated by a point source of 470 nm, it produced light emission free of visible variation in color on its surface opposite to the illuminated surface.

Example 3

In a mixer, a 99.9% purity yttrium oxide $Y_2O_3$ powder having an average particle size of 1.0 μm, a 99.0% purity aluminum oxide $Al_2O_3$ powder having an average particle size of 0.5 μm, and a 99.9% purity cerium oxide $CeO_2$ powder having an average particle size of 0.2 μm were combined in a molar ratio of Y:Al:Ce=2.99:5:0.01 and mixed for 30 minutes, obtaining a powder mixture. The powder mixture was fired in ambient atmosphere at 1,400° C. for 4 hours, yielding a source powder (1-1) of garnet phase-forming mono-phase composition.

An amount of silicon oxide powder was added to the source powder (1-1) so as to provide a content of 2,000 ppm and mixed in a mixer for one hour, obtaining 100 g of a source powder (3) for sintering. The source powder (3) was press molded by a uniaxial press and vacuum sintered at 1,780° C., yielding a dense sintered body. From the sintered body, a strip of 1.5 mm long, 2.0 mm wide and 200 μm thick was cut out, which was ready for use as a wavelength converting member.

Figure 4:
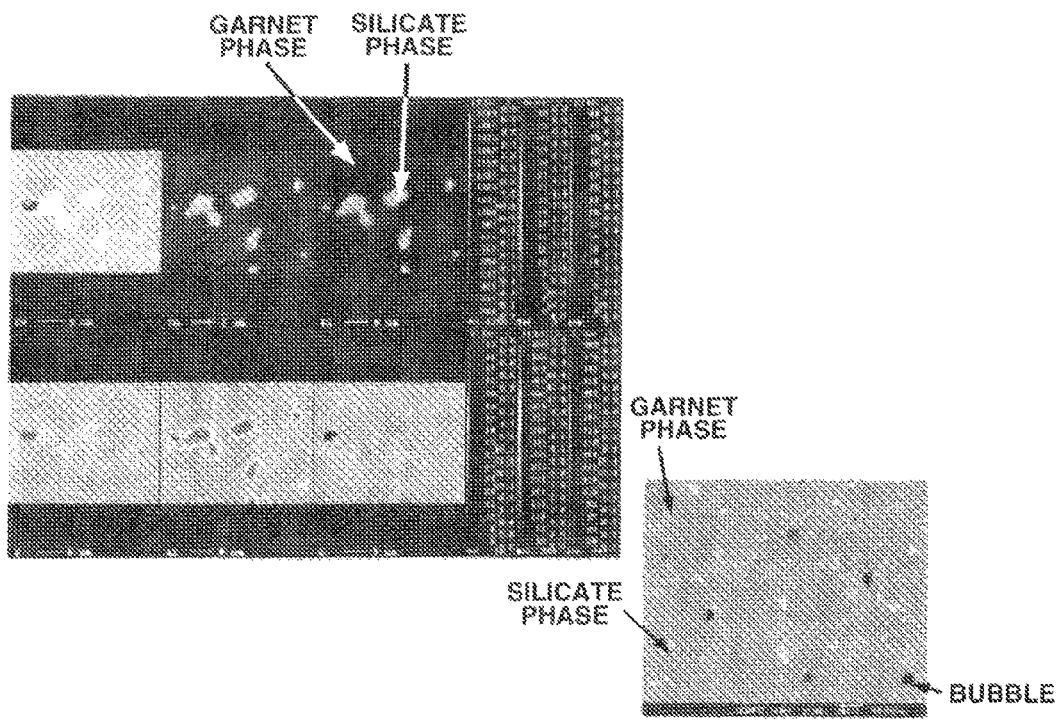
FIG. 4 illustrates an electron micrograph and EPMA image of the wavelength converting member obtained in Example 3.

This wavelength converting member was measured to have a sintered density of 4.54 g/cm$^3$ and a porosity of 0.2 vol %. An observation in cross section of the wavelength converting member indicated a dense sintered body with few bubbles. On qualitative analysis of the wavelength converting member by XRD, the primary phase consisted of YAG phase (garnet phase) and the presence of silicate phase was confirmed. An electron microscope observation and EPMA of the wavelength converting member demonstrated the structure that silicate phase grains having an average grain size of about 5 μm were present in YAG phase in the state that silicate phase grains were included and dispersed in YAG phase. FIG. 4 illustrates the electron micrograph and EPMA image.

When the wavelength converting member was activated with light of 470 nm, it showed an inner quantum efficiency of 0.92. Also, when one surface of the wavelength converting member was illuminated by a point source of 470 nm, it produced light emission free of visible variation in color on its surface opposite to the illuminated surface.

Comparative Example 1

Source powder (1-1), 500 g, was obtained by the same procedure as in Example 1. Next, the resulting source powder (2) was press molded by a uniaxial press and vacuum sintered at 1,750° C., yielding a dense sintered body. From the sintered body, a strip of 1.5 mm long, 2.0 mm wide and 200 thick was cut out, which was ready for use as a wavelength converting member.

Figure 5:
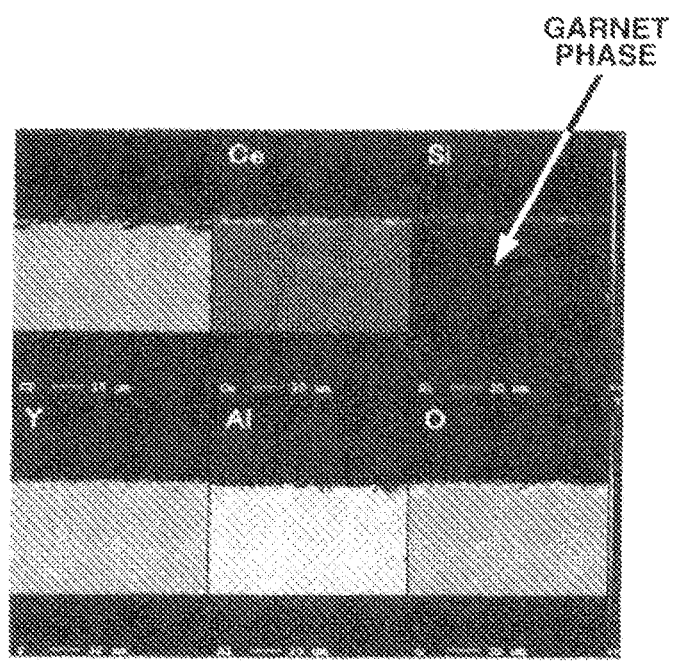
FIG. 5 illustrates an electron micrograph and EPMA image of the wavelength converting member obtained in Comparative Example 1.

This wavelength converting member was measured to have a sintered density of 4.55 g/cm$^3$ and a porosity of 0.1 vol %. On qualitative analysis of the wavelength converting member by XRD, it consisted of garnet phase. On an electron microscope observation and EPMA of the structure of the wavelength converting member, no phase other than the garnet phase was seen. FIG. 5 illustrates the electron micrograph and EPMA image.

When the wavelength converting member was activated with light of 470 nm, it showed an inner quantum efficiency of 0.90. Also, when one surface of the wavelength converting member was illuminated by a point source of 470 nm, it produced light emission with a visible variation in color on its surface opposite to the illuminated surface.

Japanese Patent Application No. 2010-108249 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A wavelength converting member comprising a polycrystalline sintered ceramic comprising
    (A) a garnet phase having the compositional formula (1):

$$(A_{1-x}B_x)_3C_5O_{12} \tag{1}$$

wherein A is at least one rare earth element selected from the group consisting of Y, Gd, and Lu, B is at least one rare earth element selected from the group consisting of Ce, Nd, and Tb, C is at least one element selected from the group consisting of Al and Ga, and x is a number from 0.002 to 0.2, and
    (B) at least one phase selected from the group consisting of perovskite, monoclinic and silicate phases, wherein fine grains of phase (B) are included and dispersed in phase (A).

2. The wavelength converting member of claim 1 wherein the perovskite phase comprises at least one rare earth element selected from the group consisting of Y, Gd, and Lu, at least one rare earth element selected from the group consisting of Ce, Nd, and Tb, at least one element selected from the group consisting of Al and Ga, and oxygen.

3. The wavelength converting member of claim 1 wherein the monoclinic phase comprises at least one rare earth element selected from the group consisting of Y, Gd, and Lu, at least one rare earth element selected from the group consisting of Ce, Nd, and Tb, at least one element selected from the group consisting of Al and Ga, and oxygen.

4. The wavelength converting member of claim 1 wherein the silicate phase comprises at least one rare earth element selected from the group consisting of Y, Gd, and Lu, at least one rare earth element selected from the group consisting of Ce, Nd, and Tb, at least one element selected from the group consisting of Al and Ga, silicon, and oxygen.

5. The wavelength converting member of claim 1 wherein the fine grains of phase (B) have an average grain size of at least 0.1 μm.

6. The wavelength converting member of claim 1 wherein the sintered ceramic has a porosity of up to 0.1% by volume.

7. A light-emitting device comprising a light source and the wavelength converting member of claim 1 wherein a portion of light from the light source passes through the wavelength converting member and another portion of light from the light source is wavelength converted by the wavelength converting member and these portions are combined to produce a light output.

8. A method for manufacturing the wavelength converting member of claim 1, comprising the steps of mixing a first source powder comprising the elements contained in phase (A) in such a composition as to form phase (A), with a second source powder comprising the elements contained in phase (B) in such a composition as to form phase (B), shaping the powder mixture into a formed body, and heating the body for sintering.

\* \* \* \* \*